US011337416B1

(12) United States Patent
Walsh et al.

(10) Patent No.: US 11,337,416 B1
(45) Date of Patent: May 24, 2022

(54) REMOTE SENSING MECHANICAL RODENT TRAP

(71) Applicant: Bell Laboratories, Inc., Madison, WI (US)

(72) Inventors: James R. Walsh, Wauwatosa, WI (US); Patrick J. Lynch, Fort Lauderdale, FL (US)

(73) Assignee: Bell Laboratories, Inc., Madison, WI (US)

( * ) Notice: Subject to any disclaimer, the term of this patent is extended or adjusted under 35 U.S.C. 154(b) by 275 days.

(21) Appl. No.: 16/659,254

(22) Filed: Oct. 21, 2019

Related U.S. Application Data

(60) Provisional application No. 62/748,651, filed on Oct. 22, 2018.

(51) Int. Cl.
*A01M 23/38* (2006.01)
*G01R 33/07* (2006.01)
*A01M 23/30* (2006.01)
*A01M 23/24* (2006.01)

(52) U.S. Cl.
CPC ............ *A01M 23/38* (2013.01); *A01M 23/30* (2013.01); *G01R 33/07* (2013.01); *A01M 23/245* (2013.01)

(58) Field of Classification Search
CPC ........ A01K 23/38; A01K 23/30; G01R 33/07; A01M 23/245; A01M 23/24; A01M 23/26; A01M 23/265; A01M 23/38; A01M 23/30
See application file for complete search history.

(56) References Cited

U.S. PATENT DOCUMENTS

| 6,508,031 | B1 | 1/2003 | Johnson et al. |
| 6,574,912 | B1 | 6/2003 | Johnson |
| 10,548,308 | B2 | 2/2020 | Howard et al. |
| 10,765,106 | B2 * | 9/2020 | Crezee .................. A01M 23/00 |
| 2017/0336832 | A1 * | 11/2017 | Furlong ................. G01D 5/145 |
| 2018/0199565 | A1 | 7/2018 | Zosimadis |
| 2018/0235205 | A1 | 8/2018 | Howard et al. |
| 2018/0301018 | A1 | 10/2018 | Seifer et al. |

FOREIGN PATENT DOCUMENTS

WO   WO-2007026123 A1 *  3/2007  ............ A01M 23/30

* cited by examiner

Primary Examiner — Timothy D Collins
Assistant Examiner — Maria E Graber
(74) Attorney, Agent, or Firm — Stiennon & Stiennon

(57) ABSTRACT

A mechanical rodent trap has a jaw mounted to a base, with a trigger therebetween which is activated by the incidence of a rodent. An acceleration sensor is mounted in a case in the base in a sensor module that logs and transmit a signal indicating activation of the trap. Alternatively a magnet holder secures a magnet to the trigger, and a Hall effect sensor is used in the sensor module. The sensor modules are sealed within a compartment formed with the base beneath the trigger and closed by a cover.

11 Claims, 4 Drawing Sheets

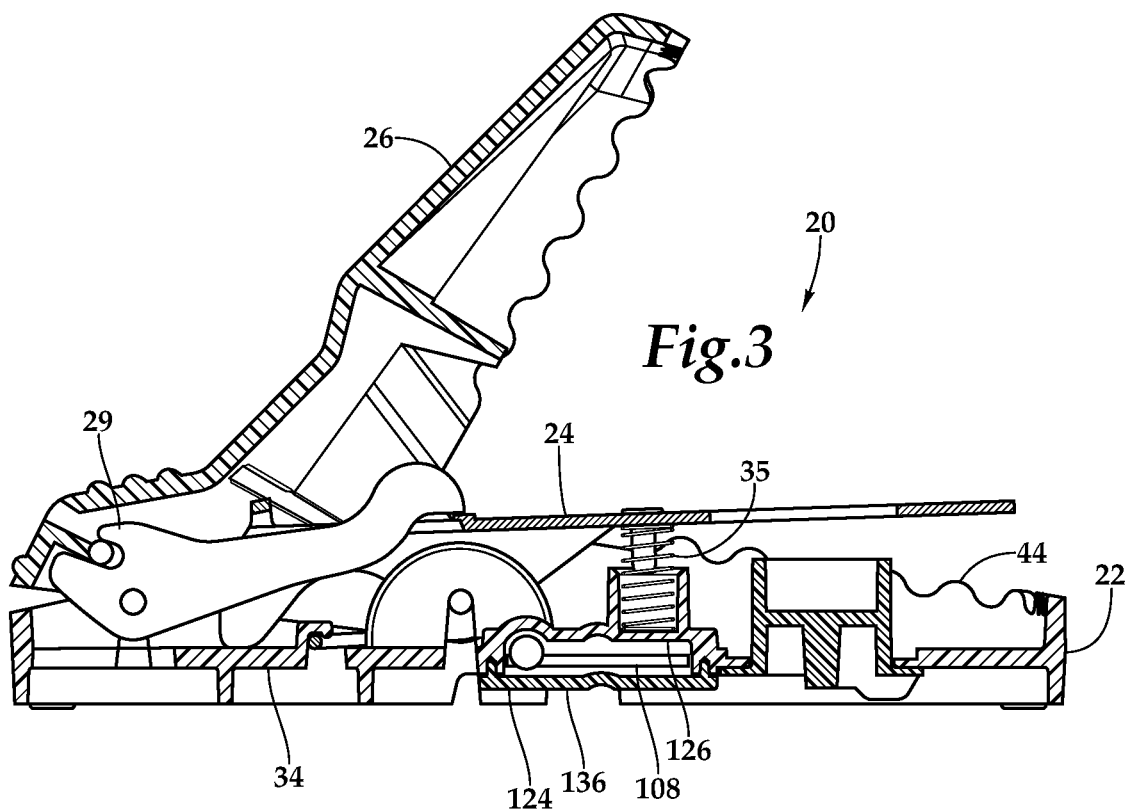
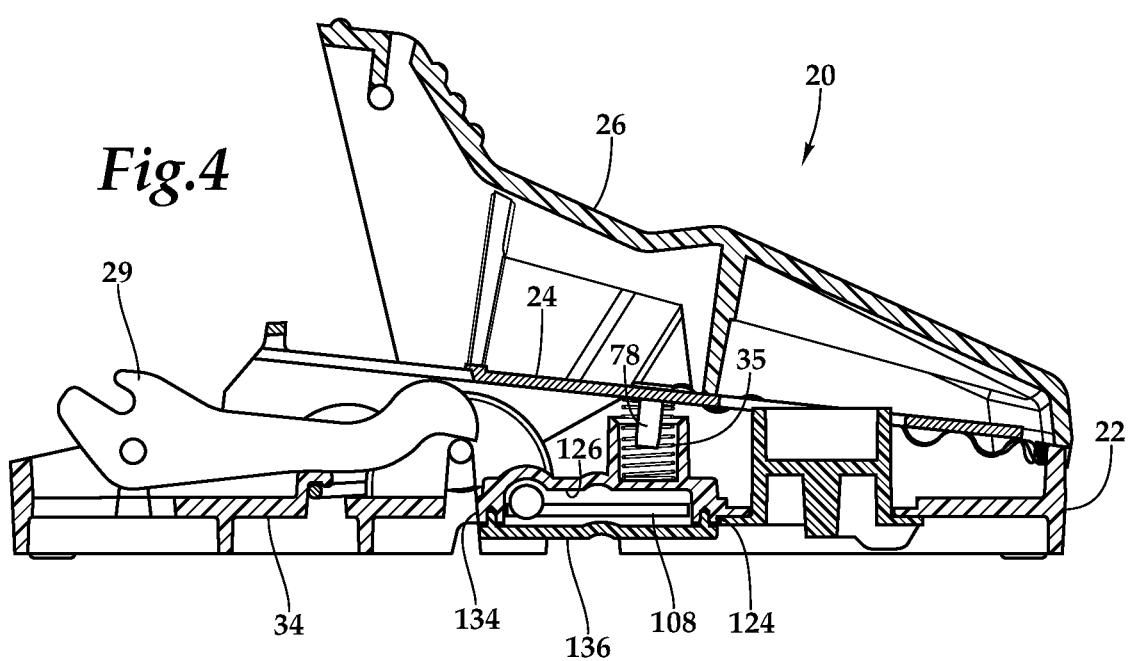

REMOTE SENSING MECHANICAL RODENT TRAP

CROSS REFERENCES TO RELATED APPLICATIONS

This application claims priority on U.S. provisional App. No. 62/748,651, filed Oct. 22, 2018, the disclosure of which is incorporated by reference herein.

STATEMENT AS TO RIGHTS TO INVENTIONS MADE UNDER FEDERALLY SPONSORED RESEARCH AND DEVELOPMENT

Not applicable.

BACKGROUND OF THE INVENTION

The present invention relates to rodent traps in general, and to rodent traps which can send an electronic signal indicating activation in particular.

Rodents such as mice and rats are perennial pests, devouring food stores, spreading disease, soiling dwellings and storage and production facilities, and degrading fixtures and structures by gnawing, scratching, and nesting. Some rodent infestations may be dealt with by the distribution of poisoned bait. In other situations, where it is desirable to avoid the use of rodenticide, or where the retention of the targeted rodent is necessary, mechanical rodent traps may be employed.

For the capture of rats, sturdy mechanical rodent traps have been developed, such as disclosed in U.S. Pat. No. 6,574,912, issued Jun. 10, 2003. Moreover, electronic systems for detecting rodents, making a date-stamped record and notifying remote Bluetooth® wireless transceiver equipped devices are disclosed in U.S. publication US 2018/0199,565.

Typically, in commercial installations, a wide array of rodent traps will be positioned within a facility. A Pest Control Operator (PCO) will regularly inspect each trap placement, thereby determining the source and frequency of rodent infestation.

What is needed is a rodent trap configured to work with electronics which reliably detect and record trap activation and communicate with a device under the control of the Pest Control Operator, thereby enabling efficient and reliable supervision and maintenance of trap emplacements.

SUMMARY OF THE INVENTION

The rodent trap of this invention has a plastic base to which a plastic upper jaw, i.e., hammer, is attached which is pivotably mounted by a steel pin. A spring is engaged between the base and the upper jaw and urges the jaw to close upon the base. A trigger is pivotably mounted by the pin to ears which project upwardly from the base. A catch mechanism or hold-down operates to restrain the upper jaw in a set position until the trigger is actuated. A sensor module is mounted in a receptacle formed in the base. The Sensor module includes a SW-18010P, a spring based omnidirectional vibration/acceleration sensor which is normally off, but is momentarily on when triggered, which detects closure of the trap. The sensor module also has a Bluetooth transceiver/micro controller 110, e.g, a Silicon labs EFR32 chip set, a battery, and a PCB trace antenna. An alternative type sensor is a Hall effect device which senses a magnetic field generated by a magnet mounted to a portion of the trap e.g., the trap trigger, which moves relative to the trap base when the trap is triggered and closes. The moving magnet produces a change in magnetic fields at the Hall effect sensor which is sensitive to such changes so providing a trap activation signal. The rodent trap can be deployed in bait stations often mounted to a tray which can also be used for rodenticide or tracking bait. The trap can also be used independent of a bait station for example by attaching it to a fixed object often a pipe along which rodents travel. To facilitate a standalone application the trap base has two upwardly extending side walls each having an opening adjacent the floor of the base. A cable tie may extend through the opposed openings in the opposite side walls and to be looped around a pipe, beam, or other support member, and the ends of the tie may be connected to secure the rodent trap to the support member upon which it is mounted. The rodent trap is thus secured directly to the support member without any intervening support platform.

It is an object of the present invention to provide a mechanical rodent trap which effectively incorporates electronics which detect activation and log the activation, so the trap can be interrogated remotely to determine if it has been activated.

It is another object of the present invention to provide a rodent trap with structure to effectively retain and position electronics which reliably distinguish between trap activation and other stresses experienced by the trap, to send a true electronic signal indicating activation.

Further objects, features and advantages of the invention will be apparent from the following detailed description when taken in conjunction with the accompanying drawings.

BRIEF DESCRIPTION OF THE DRAWINGS

FIG. 3 is a cross-sectional view of the rodent trap of FIG. 2 in a set configuration.

FIG. 4 is a cross-sectional view of the rodent trap of FIG. 3 in a triggered configuration.

DESCRIPTION OF THE PREFERRED EMBODIMENTS

Figure 1:
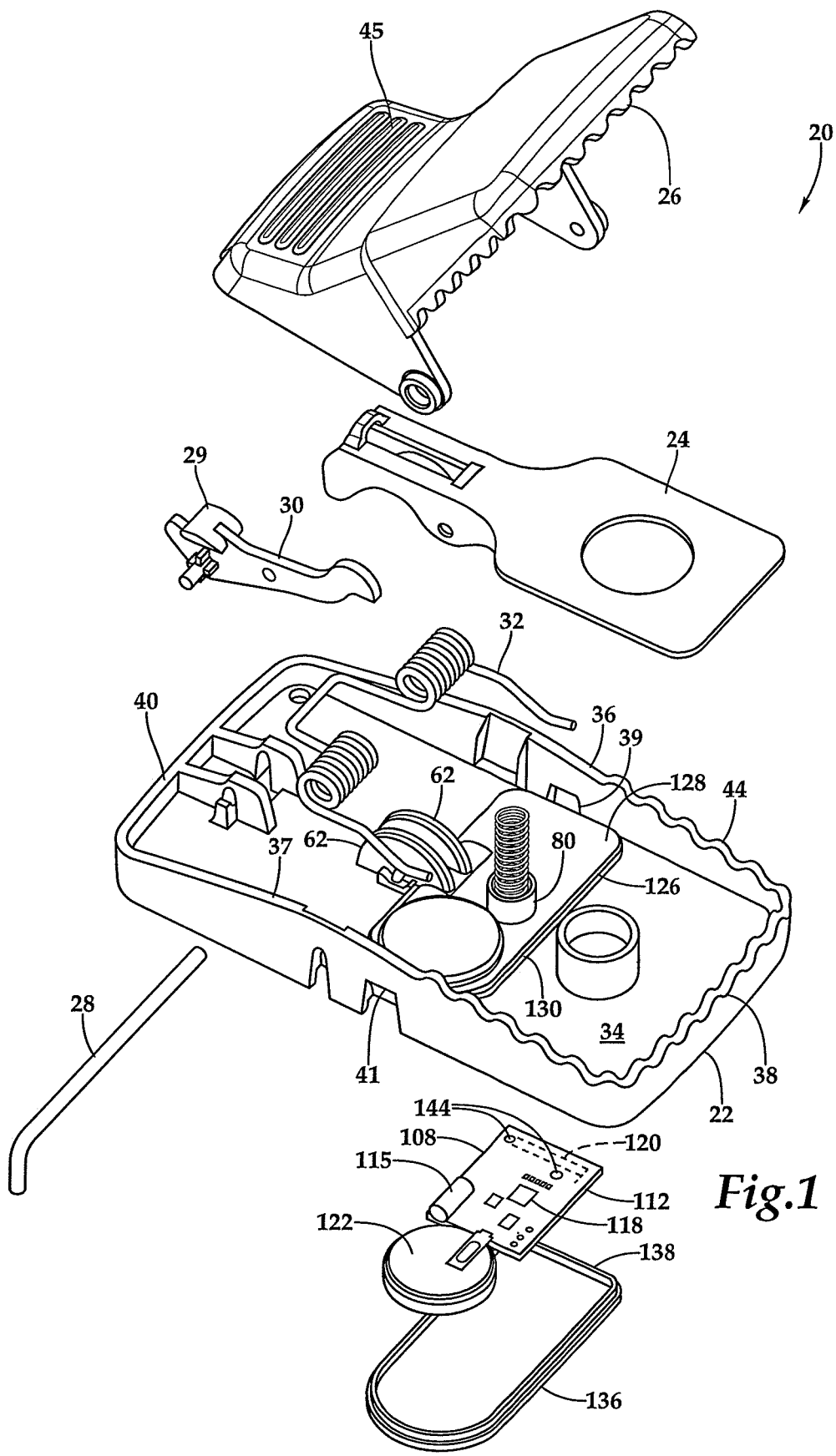
FIG. 1 is an exploded isometric view of the rodent trap of this invention.

Referring more particularly to FIGS. 1-8, wherein like numbers refer to similar parts, a Bluetooth connected rodent trap 20 of this invention is shown in FIG. 1. The trap has a plastic base 22 to which a plastic trigger 24 and an upper jaw or hammer 26 are pivotably connected by a metal pin 28. A sensor module 108 is associated with the base 22 to detect rodent activation of the trap as set out below. A catch mechanism or hold-down 30 extends from the base 22 and engages with the trigger 24 and the upper jaw 26 to retain the upper jaw 26 in a set position against the force of a spring 32 which tends to urge the upper jaw 26 into a sprung or trapping position. The base 22 and upper jaw 26 may be provided with interdigitating teeth 44.

Figure 2:
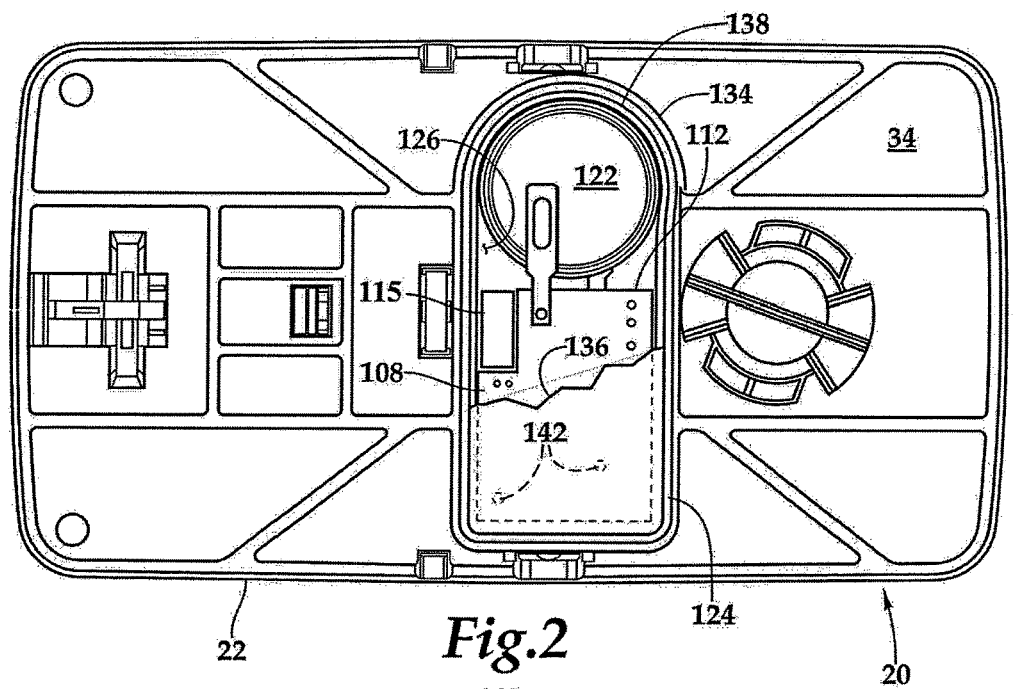
FIG. 2 is a bottom plan view of the rodent trap of FIG. 1, with the sensor module cover partially broken away.

The trap 20 is preferably large enough to accommodate rats. The base 22 may be about 5.6 inches long and three inches wide. The base 22 has a horizontal platform wall 34 with a vertically extending first side wall 36 and second side wall 37. A front wall 38 and a rear wall 40 extend between the side walls 36, 37. The platform wall 34 is supported about 0.20 inches above the support surface on which the trap rests, and preferably has a pattern of reinforcing ribs on its underside, as shown in FIG. 2. The first side wall 36 has a first opening 39 which extends above the level of the platform wall 34, and the second side wall 37 has a second opening 41 which also extends above the level of the platform wall.

Two ears 62 extend upwardly from the base 22 above the platform wall 34. The trigger and the upper jaw 26 are pivotably mounted to the base by the pin 28 which extends through the ears 62. The spring 32 is mounted about the pin 28 and acts to urge the upper jaw into a sprung or activated position. When the trap 20 is in a set position, as shown in FIG. 3, the upper jaw 26 is retained by a catch element 29 of the catch mechanism 30. When the trigger is depressed by a rodent, the upper jaw 26 closes on the base as shown in FIG. 4. A coil spring 35 restores the trigger to its upper position when the trap is reset.

The controller may be provided with signal analysis software to analyze accelerometer signals to determine between a signal corresponding to trap activation and other forces applied to the trap, for example traffic or other environmental vibrations, loud noises, displacing forces etc.

Electronic monitoring is achieved by the sensor module 108 which is sealed within a case 124 defined by a downwardly opening compartment 126 integrally formed with the base 22 and case cover 136. The compartment 126 has an upper wall 128 with a downwardly extending side wall 130. The sensor module 108 is positioned within the compartment 126 which is on the underside of the base 22, and is thereby positioned in a location to effectively detect the significant forces experienced by the trap when the upper jaw 24 is driven against the base 22 by the spring 32. As shown in FIGS. 1 and 4, the sensor module is positioned below the cup 80 which receives the spring 35 around the stud 78 which extends downwardly from the trigger 24. The sensor module technology may employ a standard FR4 printed circuit board (PCB) 112 on which is included a SW-18010P spring based omnidirectional vibration/acceleration sensor 115 which is normally off, but is momentarily on when triggered which detects closure of the trap. Other types of accelerometer could be used. On the same PCB 112 are mounted a Bluetooth chip set and programmable controller 118, e.g., Silicon labs EFR32 product family. The controller has programmable functionality. The sensor module 108 further has a power supply comprising one or more batteries, such as long-life lithium cells 122 and a trace antenna 120. The sensor module 108 containing the accelerometer is sealed from the environment within the plastic case 124. As shown in FIG. 2, a double lip 134 is formed on the perimeter of the case compartment 126 side wall 130 and extends downwardly from the base bottom wall 34. The sensor module 108 is received within the case 124 with the battery 122 and the trace antenna 120 on the PCB 112.

The case cover 136, shown in FIG. 1, is affixed to the base to close the compartment 126. The case cover 136 has an upwardly protruding peripheral bead 138 which extends between the double peripheral lip 134 extending from the case compartment 126 side wall 130 beneath the base bottom wall 34. The case cover 136 may be affixed in place such as by glue or ultrasonic welding to define a sealed compartment and protect the electronics of the sensor module 108 from moisture. The PCB 112 may be potted or glued to the upper wall 128 of the case compartment, which is integral with the bottom wall 34 of the base. As shown in FIG. 2, the compartment upper wall 128 may have a plurality of molded plastic pins 142 which extend into pin holes 144 which extend through the PCB 112, as shown in FIG. 1. The pins 142 serve to register the position of the PCB 112 with respect to the case 124.

When the trap is activated, as shown in FIG. 4, the accelerometer emits a momentary on signal indicative of trap activation, and the triggering/closing of the trap is electronically entered by the programmable controller in a log with a time and date stamp. A Pest Control Operator (PCO) or other operator passing within the vicinity of the sensor module with an electronic device can thus detect the sprung condition of the trap. When an external Bluetooth communication link, such as that provided by a PCO's smartphone running an app, interrogates the sensor module 108, the module communicates the contents of the log to the smart phone for recognition within the app. The sensor module log contents may simply indicate whether the trap 20 has been triggered/closed or not, and include the times, if any, when the trap was visited by the PCO. Each sensor module 108 in each trap 20 has a unique identifier, so the app can keep track of the multiple traps deployed and provide such functionality as indicating when a signal has been received from traps in a particular location and provide a map to any traps which have been triggered/closed. Depending on the bluetooth transceiver power and sensitivity of the sensor module and of the smart phone, the sensor module may require the Pest Control Operator to traverse within a certain distance of each trap. In other circumstances the sensor module may have enough range that it is sufficient simply to travel to various deployment areas which can be checked without walking the line along which the traps are deployed. In either case the effort in visiting every trap and determining its status and logging the status no longer needs to be done manually by the Pest Control Operator.

In the sprung or unset condition, the trap presents no danger to the user, and there is no risk of an unintentional closure on the user's fingers. The trap upper jaw pivots about a transverse axis, which is generally perpendicular to the direction of travel of a rodent, and likewise generally perpendicular to the support member axial direction. The upper jaw 26 is generally closed, offering protection for the user against inadvertently coming into contact with the trigger when setting the trap. The closed plastic expanse of the upper jaw 26 defines a gripping surface 45 which is engaged by the user's hand when being set.

Figure 7:
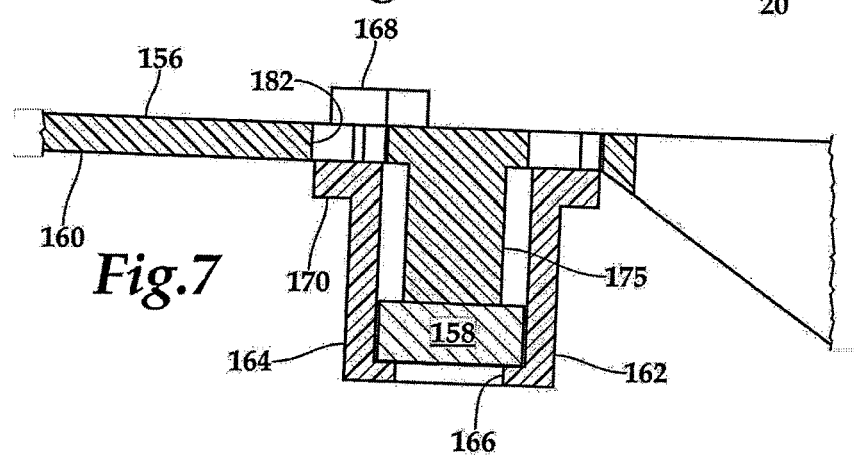
FIG. 7 is a fragmentary cross-sectional view of the trigger with attached magnet of the rodent trap of FIG. 6 taken along section line 7-7.
Figure 5:
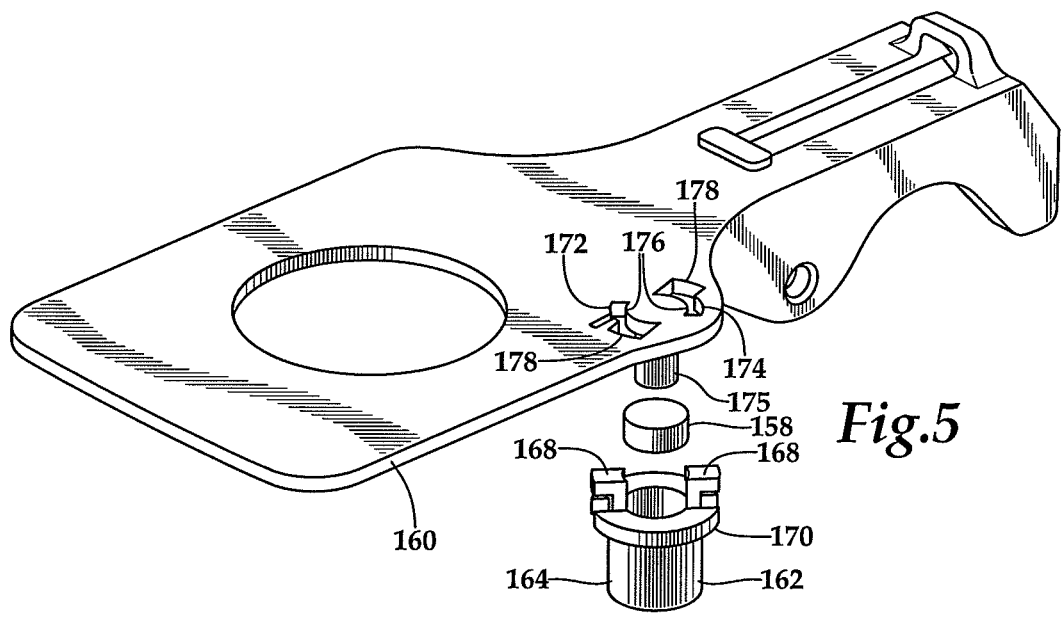
FIG. 5 is an exploded isometric view of a trigger assembly of an alternative embodiment rodent trap of this invention.
Figure 6:
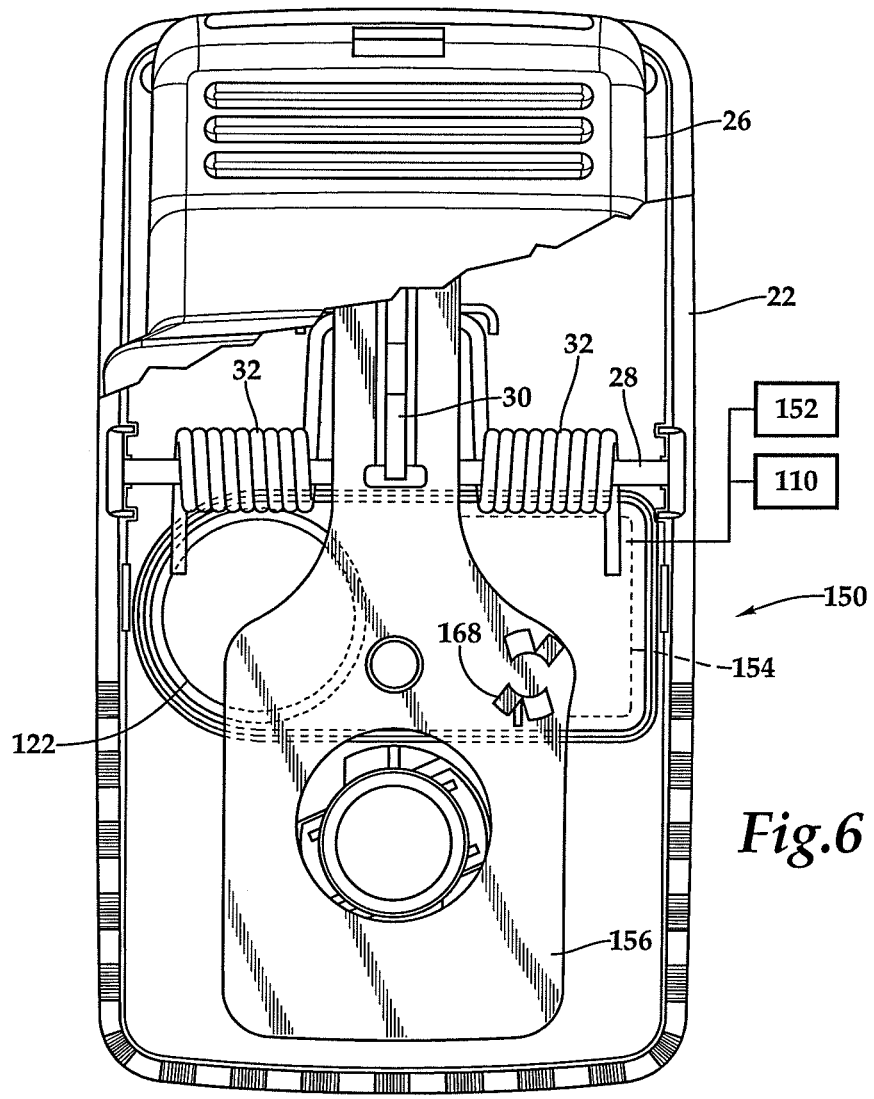
FIG. 6 is a top plan view of a rodent trap including the trigger assembly of FIG. 5, with the upper jaw broken away. Certain electronic components are indicated schematically.

An alternative embodiment rodent trap 150 is shown in FIGS. 5-7. The trap 150 employs a Hall effect sensor 152 within a sensor module 154 and an alternative trigger 156 which has a magnet 158 mounted beneath the forward trigger plate 160. The sensor module 154 and trigger 156 are mounted to a plastic base 22 similar to the one described above. The trap 150 has an upper jaw 26, a metal pin 28 mounting the upper jaw to the base 22, a catch element, a catch mechanism 30, and an actuating spring 32 arranged as described above with respect to the trap 20. A battery 122 is provided.

A Hall effect sensor is a transducer which has an output voltage which varies in response to a magnetic field. The Hall effect sensor 152 can thus return an output based on the proximity of the trigger magnet 158 to the sensor. Activation of the trap causes the trigger plate 160 to pivot towards the base 22, thereby bringing the magnet 158 closer to the sensor and reliably indicating the activation of the trap. As shown in FIG. 5, the magnet 158 may be a cylindrical element which is received within a cup-like magnet holder 162. The magnet holder 162 has a cylindrical shell 164 which has a radially inwardly extending lower lip 166, shown in FIG. 7. For convenient assembly to the trigger plate 160, the magnet holder has two tabs 168 which extend radially outwardly from the shell 164 above a peripheral flange 170. The flange 170 is spaced below the tabs 168 a sufficient distance to accept the thickness of the trigger plate 160.

Figure 8:
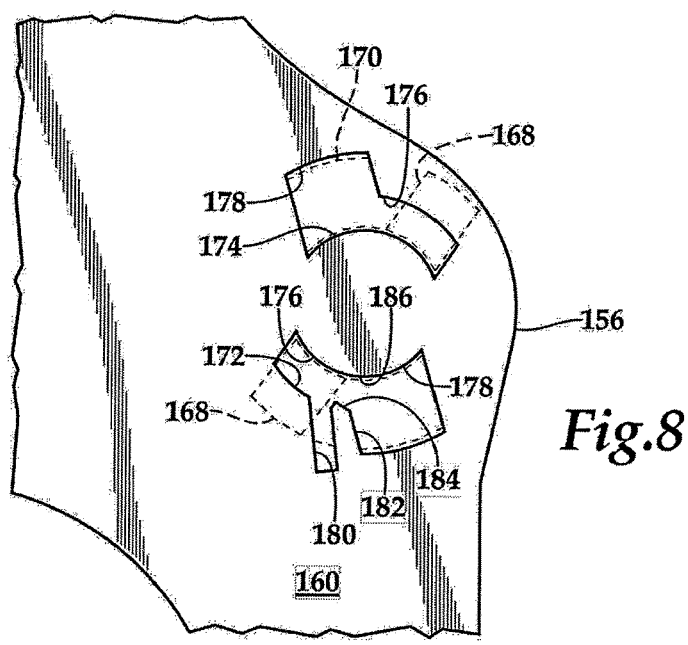
FIG. 8 is an enlarged fragmentary view of the trigger with attached magnet of the rodent trap of FIG. 6, in which for clarity the magnet holder is shown in broken lines.

Two slots 172, 174 are formed to pass through the trigger plate 160, as shown in FIG. 5. The slots are positioned radially exteriorly to a downwardly extending cylindrical rod 175 which is of a diameter to be received within the magnet holder shell 164. As shown in FIG. 8, each slot 172, 174 has a curved section 176 of a first width, and an entrance section 178 of a second, wider width which is sufficient to admit one of the magnet holder tabs 168 therethrough. The first slot 172 has an outwardly extending segment 180 which is angled with respect to a strictly radial direction, to thereby define a cam tooth 182 between the segment 180 and the entrance section 178 of the first slot. The segment 180 is wider than the entrance section 178. The cam tooth 182 has a beveled inner cam surface 184. The distance between the inner cam surface 184 and the inner perimeter 186 of the first slot 172 curved section 176 is less than the first width. The magnet 158 is assembled to the trigger plate 160 by being inserted into the magnet holder 162 shell 164 to abut against the shell lip 166. The magnet holder tabs 168 are passed upwardly through the entrance sections 178 of the slots 172, 174 in the trigger plate 160, and the magnet holder is rotated clockwise. The tab 168 within the first slot 172 engages the inner cam surface 184 causing the cam tooth 182 to deflect until the tab passes past it, at which point the cam tooth 182 returns to its initial position, locking the magnet holder in position. As shown in FIG. 7, the trigger rod 175 extends into the magnet holder to engage and restrain the magnet in a specific position beneath the trigger plate 160.

When a rodent engages the trigger and displaces the catch element 29, the trigger plate pivots downwardly and the upper jaw 26 closes on the base 22. The displacement of the trigger plate 160 downwardly brings the magnet 158 into closer proximity to the Hall effect sensor beneath the base 22 within the case, causing the Hall effect sensor to send a signal which can be logged as a trap activation.

It should be understood that the sensor module is not used as a generic or a nonce term. Applicant has disclosed a standard FR4 printed circuit board (PCB) on which is attached a SW-18010P omnidirectional vibration, acceleration switch which is normally off, but is momentarily on when vibration/acceleration is present which detects closure of the trap. Or alternatively a Hall effect sensor may be used with a magnet mounted to the trap trigger or upper jaw. On the same PCB are mounted a Bluetooth chip set, an antenna, a power supply comprising one or more long-life lithium cells, and a controller with programmable functionality. The sensor module may use a chip selected from, for example, the Silicon labs EFR32 product family which combines an energy-friendly MCU (microcontroller) with a highly integrated radio transceiver. The devices are well suited for battery operated application with low energy consumption.

Although a spring constrained mass, vibration switch such as Model:SW-18010P is shown, other types of shock sensors or sensors may be employed, such as a piezoelectric sensor which transforms mechanical energy into an electrical output, or a cantilevered mass sensor micromachined from a silicon substrate and using capacitance to detect movement of a cantilevered mass. If a magnet is mounted to be displaced when the trap is triggered or closed, the movement of the magnet can be detected by a Hall effect sensor, but also by other magnetic field sensitive devices such as reed switches, inductive sensors, or sensors utilizing magnetoresistance (MR), i.e. a resistant change in an iron strip to sense an externally-applied magnetic field. More sensitive devices employing multicomponent or multilayer magnetoresistance devices include giant magnetoresistance (GMR), tunnel magnetoresistance (TMR), colossal magnetoresistance (CMR), and extraordinary magnetoresistance (EMR).

It is understood that the invention is not limited to the particular construction and arrangement of parts herein illustrated and described, but embraces all such modified forms thereof as come within the scope of the following claims.

We claim:

1. A rodent trap, comprising;
   a plastic base having portions which define a downwardly opening compartment having an upper wall and a downwardly extending side wall;
   a hammer mounted to the base;
   a spring mounted between the hammer and the base;
   a hold-down arranged to retain portions of the hammer spaced from the base, and engaged with a trigger in a set configuration;
   wherein the trigger is mounted to the base above the compartment upper wall and arranged to, when activated by a rodent, release the hold down and to thereby release the hammer, such that the portions of the hammer may strike a rodent on the base;
   a sensor module with a sensor positioned within the base downwardly opening compartment, the sensor being configured to determine activation of the trap, the sensor module having a radio transceiver, a battery, and a microcontroller; and
   a cover fixed to the compartment side wall to seal the sensor module within the compartment.

2. The rodent trap of claim 1 wherein the sensor comprises an accelerometer.

3. The rodent trap of claim 1 further comprising a magnet mounted to the trigger, and wherein the sensor is a Hall effect sensor.

4. The rodent trap of claim 1 further comprising a magnet mounted to the trigger, and wherein the sensor is selected from the group consisting of a reed switch, an inductive sensor, a magnetoresistant sensor, a giant magnetoresistant sensor, a tunnel magnetoresistant sensor, a colossal magnetoresistant sensor and an extraordinary magnetoresistant sensor.

5. A rodent trap, comprising:
   a base;
   a hammer mounted to the base;
   a spring mounted between the hammer and the base;
   a hold-down arranged to retain portions of the hammer spaced from the base, and engaged with a trigger in a set configuration, wherein
   the trigger is arranged to release the hold down when activated and to thereby release the portions of the hammer to strike the base, the trigger having a plate;
   a magnet mounted to the trigger plate;

a sensor module with a Hall effect sensor mounted to the base, such that when a rodent engages the trigger and displaces the hold down, the trigger plate pivots downwardly and the hammer is released to move towards the base, and the displacement of the trigger plate downwardly brings the magnet into closer proximity to the Hall effect sensor causing the Hall effect sensor to send a signal which can be logged as a trap activation;

portions of the base which define a downwardly opening compartment, wherein the sensor module is disposed within said compartment;

a cover fixed to the base to seal the sensor module within the compartment;

a plurality of pins which extend downwardly from the compartment upper wall; and portions of the sensor module which define holes which receive said plurality of pins, the sensor module being thereby fixed in position with respect to the base.

6. A rodent trap, comprising:

a base;

a hammer mounted to the base;

a spring mounted between the hammer and the base;

a hold-down arranged to retain portions of the hammer spaced from the base, and engaged with a trigger in a set configuration, wherein the trigger is arranged to release the hold down when activated and to thereby release the portions of the hammer to strike the base, the trigger having a plate;

a magnet mounted to the trigger plate;

a sensor module with a Hall effect sensor mounted to the base, such that when a rodent engages the trigger and displaces the hold down, the trigger plate pivots downwardly and the hammer is released to move towards the base, and the displacement of the trigger plate downwardly brings the magnet into closer proximity to the Hall effect sensor causing the Hall effect sensor to send a signal which can be logged as a trap activation;

portions of the base which define a downwardly opening compartment, wherein the sensor module is disposed within said compartment;

a cover fixed to the base to seal the sensor module within the compartment;

portions of the compartment side wall which define a perimeter double lip which extends downwardly from a base bottom wall; and portions of the cover which define an upwardly protruding peripheral bead which extends between the double peripheral lip.

7. The rodent trap of claim 6 wherein the cover is affixed in place to the compartment side wall by glue or ultrasonic welding to define a sealed compartment protective of the sensor module from moisture.

8. The rodent trap of claim 6 wherein the sensor module is potted.

9. The rodent trap of claim 6 wherein the sensor module is glued to the upper wall of the case compartment.

10. A rodent trap, comprising:

a base;

a hammer mounted to the base;

a spring mounted between the hammer and the base;

a hold-down arranged to retain portions of the hammer spaced from the base, and engaged with a trigger in a set configuration, wherein the trigger is arranged to release the hold down when activated and to thereby release the portions of the hammer to strike the base, the trigger having a plate;

a magnet mounted to the trigger plate;

a sensor module with a Hall effect sensor mounted to the base, such that when a rodent engages the trigger and displaces the hold down, the trigger plate pivots downwardly and the hammer is released to move towards the base, and the displacement of the trigger plate downwardly brings the magnet into closer proximity to the Hall effect sensor causing the Hall effect sensor to send a signal which can be logged as a trap activation; and a cup-like magnet holder, which extends downwardly from the trigger plate, and the magnet is positioned within the magnet holder and thereby mounted to the trigger plate.

11. The rodent trap of claim 10 wherein the magnet is cylindrical, and the magnet holder has a cylindrical shell with a radially inwardly extending lower lip, against which lower lip the cylindrical magnet is disposed, and the trigger has a downwardly extending rod which extends into the magnet holder to engage and restrain the magnet in a specific position beneath the trigger plate.

* * * * *